US011258234B2

(12) United States Patent
Chen et al.

(10) Patent No.: US 11,258,234 B2
(45) Date of Patent: Feb. 22, 2022

(54) EYE SAFE VCSEL ILLUMINATOR PACKAGE

(71) Applicant: Princeton Optronics, Inc., Mercerville, NJ (US)

(72) Inventors: Tong Chen, Mercerville, NJ (US); Qing Wang, Singapore (SG)

(73) Assignee: Princeton Optronics, Inc., Mercerville, NJ (US)

( * ) Notice: Subject to any disclaimer, the term of this patent is extended or adjusted under 35 U.S.C. 154(b) by 22 days.

(21) Appl. No.: 16/487,086

(22) PCT Filed: Feb. 15, 2018

(86) PCT No.: PCT/US2018/018301
§ 371 (c)(1),
(2) Date: Aug. 19, 2019

(87) PCT Pub. No.: WO2018/156412
PCT Pub. Date: Aug. 30, 2018

(65) Prior Publication Data
US 2020/0052466 A1    Feb. 13, 2020

Related U.S. Application Data

(60) Provisional application No. 62/463,345, filed on Feb. 24, 2017.

(51) Int. Cl.
*H01S 5/00*     (2006.01)
*H01S 5/42*     (2006.01)
(Continued)

(52) U.S. Cl.
CPC ............ *H01S 5/423* (2013.01); *H01S 5/1025* (2013.01); *H01S 5/18305* (2013.01);
(Continued)

(58) Field of Classification Search
CPC ......... H01S 5/42–423; H01S 5/18–187; H01S 5/068–0687; H01S 5/02296; H01S 5/02248; H01S 5/0264; H01S 5/06825
See application file for complete search history.

(56) References Cited

U.S. PATENT DOCUMENTS 5,812,582 A     9/1998  Gilliland et al.
5,835,514 A  * 11/1998  Yuen .................... H01S 5/02296
                                                    372/36
(Continued)

FOREIGN PATENT DOCUMENTS

EP          0786836 A2    7/1997
EP          0805528 A2   11/1997
(Continued)

OTHER PUBLICATIONS

PCT/US2018/018301 International Search Report and Written Opinion, dated May 29, 2018.
(Continued)

*Primary Examiner* — Xinning(Tom) Niu
*Assistant Examiner* — Delma R Fordé
(74) *Attorney, Agent, or Firm* — Kilpatrick Townsend & Stockton LLP

(57) ABSTRACT

A miniature illuminator is described which is suitable for assembly into mobile electronics devices such as cell phones and computer tablets. Features of the invention overcome the complexity of current miniature illuminators by using single molded structure which includes all the electrical feedthrough connections and has the features necessary for accurate mounting of optical components. The molded structure includes laser safety connections which provide an electrical interrupt signal when the illuminator is damaged in a way that could result in propagation of non-eye safe illuminator beams. In an alternate operation the illuminator provides a signal when a subject gets too close to the
(Continued)

illuminator and would receive unsafe VCSEL illuminator beam. The laser safety feature is integrated into the molded Illuminator package so that separate electrically connected structures to achieve this function are eliminated.

19 Claims, 11 Drawing Sheets

(51) Int. Cl.
    *H01S 5/10*       (2021.01)
    *H01S 5/183*     (2006.01)
    *H01S 5/30*       (2006.01)

(52) U.S. Cl.
    CPC ...... *H01S 5/18361* (2013.01); *H01S 5/18313* (2013.01); *H01S 5/3095* (2013.01)

(56) References Cited

U.S. PATENT DOCUMENTS

| | | | |
|---|---|---|---|
| 6,661,820 B1 * | 12/2003 | Camilleri | H01S 5/06825 372/38.07 |
| 7,961,770 B1 * | 6/2011 | Zhu | G02B 6/4249 372/50.21 |
| 10,444,331 B1 * | 10/2019 | Lee | G01S 7/4814 |
| 2005/0195865 A1 | 9/2005 | Aronson | |
| 2007/0077009 A1 | 4/2007 | Luyssaert et al. | |
| 2011/0188054 A1 | 8/2011 | Petronius et al. | |
| 2011/0251601 A1 | 10/2011 | Bissmann et al. | |
| 2013/0163627 A1 | 6/2013 | Seurin et al. | |
| 2014/0269796 A1 * | 9/2014 | Geske | H01S 5/187 372/34 |
| 2017/0285078 A1 * | 10/2017 | Saha | G01C 3/02 |
| 2017/0353004 A1 * | 12/2017 | Chen | H01S 5/06825 |
| 2019/0221997 A1 * | 7/2019 | Johnson | H01S 5/02248 |
| 2020/0127441 A1 * | 4/2020 | Ghosh | H01S 5/187 |

FOREIGN PATENT DOCUMENTS

| | | |
|---|---|---|
| GB | 2443662 A | 5/2008 |
| WO | 2016162236 A1 | 10/2016 |

OTHER PUBLICATIONS

EP 18757856.2 Supplementary European Search Report dated Nov. 17, 2020, 8 pages.

* cited by examiner

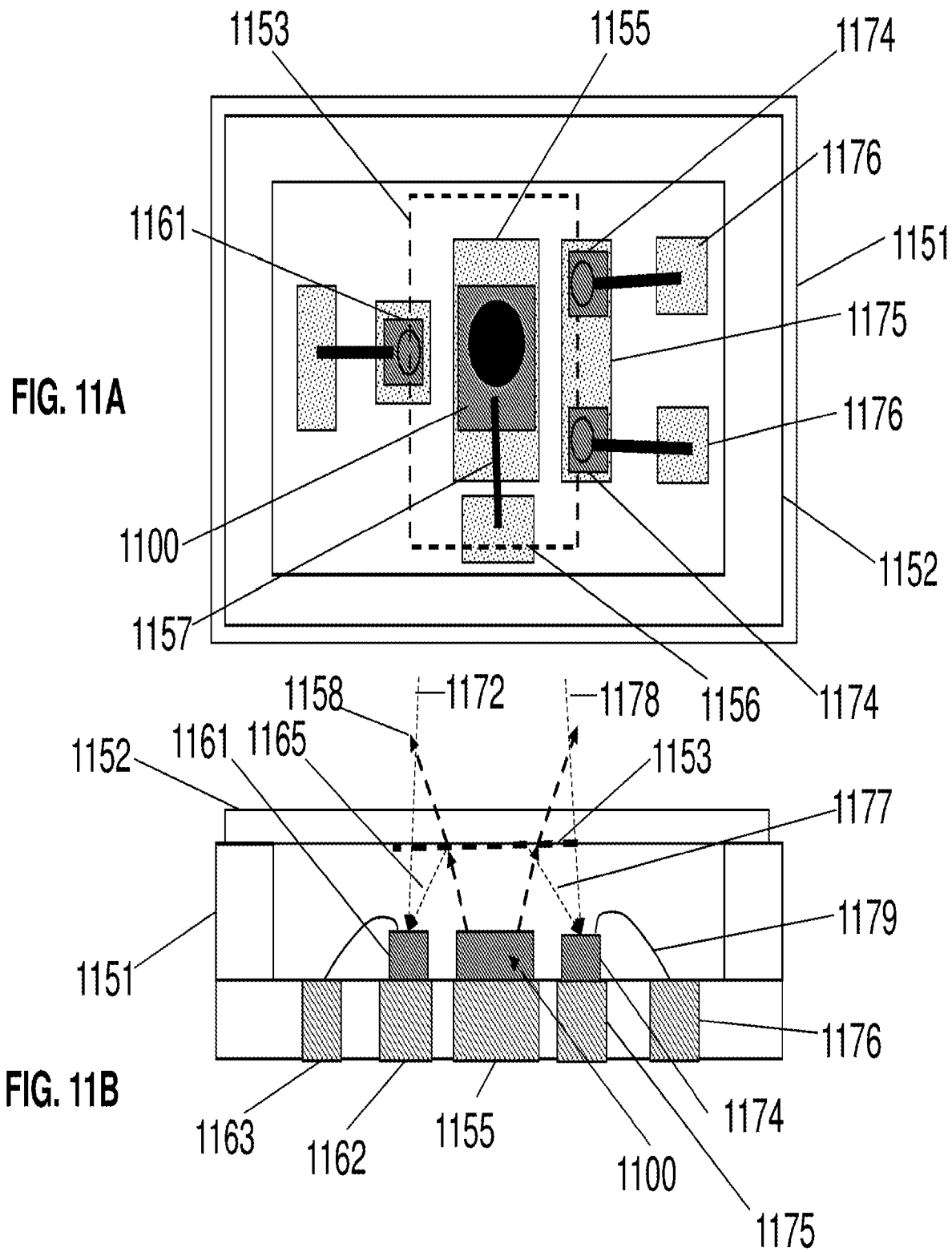

EYE SAFE VCSEL ILLUMINATOR PACKAGE

CROSS-REFERENCE TO RELATED APPLICATIONS

This application is a 371 U.S. National Phase of PCT International Application No. PCT/US2018/018301, filed on Feb. 15, 2018, which also claims the benefit of priority of U.S. Provisional Application No. 62/463,345, filed on Feb. 24, 2017; the contents of each disclosure are incorporated herein by reference in their entirety.

FIELD OF THE DISCLOSURE

The present disclosure relates to eye safe VCSEL illuminator packages.

BACKGROUND

New features are being added to cell phones and tablets which include technologies to record three dimensional images, sense motion and gestures etc. The digital recording methods use various types of miniature illuminators which interact with cameras to record dynamical events in three dimensional regions. These illuminators can be of various forms and deliver different types of functions. Some illuminate a wide area with very short pulses for LIDAR type measurements recording time of flight information. Other illuminators are pulsed or CW and project structured light patterns onto the scene. The digital camera records an image of the structured light pattern and then software algorithms are used to determine 3-dimensional scene information from modifications in the pattern image.

The illuminators are installed in mobile devices such as cell phones and tablets and therefore need to be small in size, typically 3 mm or less high and a few millimeters lateral dimensions. These illuminators must be designed for high volume low cost manufacture and also for low cost assembly into the device they are going to be used in. This means the illuminator should be compatible with high volume electronic surface mount assembly practices.

One technology that is suitable for miniature illuminators is high power VCSEL devices and array devices. These can be pulsed with very fast rise times suitable for time of flight applications. They are small but produce high power laser beams with efficient electro-optic conversion. The output beam is typically well collimated however various optical components can be placed in the beam to modify the beam properties to the specific application.

One issue with high power laser illuminators is to ensure they meet laser safety regulations when operated in the mobile devices. In one situation, the illuminator could be in an assembly that under normal operation maintains eye-safe operation by preventing any person from getting too close to the illuminator. However, if the assembly is damaged or if a technician is servicing the unit the person could get too close to the illuminator. This invention includes safety features that provide an electrical interlock signal if a person is inside the eye-safe region of the illuminator. The controller can use this signal to immediately turn off the VCSEL.

In another situation during handling the illuminator itself it can get damaged or receive a shock. The damage or shock can damage the illuminator and permit unsafe levels of illumination to be emitted. This invention includes laser safety features so that in the event of damage to any optical component in the illuminator an electrical interlock signal is provided for switching off the VCSEL.

SUMMARY

The present disclosure describes eye safe VCSEL illuminator packages. For example, in one aspect. a VCSEL illuminator module includes at least one VCSEL device, and an optical element disposed over the at least one VCSEL device. The optical element is arranged in a path of an output beam of the at least one VCSEL and operable to modify a characteristic of the output beam. The module also includes at least one optical detector arranged to receive and sense VCSEL radiation reflected or backscattered from the optical element. A control circuit is coupled to the at least one VCSEL and to the at least one optical detector, wherein the control circuit is operable to monitor one or more output signals from the at least one optical detector and to turn off drive current to the at least one VCSEL in response to a determination that there is at least a predetermined change in an intensity of the VCSEL radiation sensed by the at least one optical detector. In some implementations, a determination that there is at least a predetermined change in the intensity of the VCSEL radiation reflected or backscattered from the optical component and incident on the at least one optical detector indicates that the optical element is at least partially dislodged or damaged.

In another aspect, a VCSEL illuminator module includes at least one VCSEL device, and an optical element disposed over the at least one VCSEL device. The optical element is arranged in a path of an output beam of the at least one VCSEL and operable to modify a characteristic of the output beam. The module also includes at least one optical detector arranged to receive and sense VCSEL radiation reflected from an object outside the module. A control circuit is coupled to the at least one VCSEL and to the at least one optical detector, wherein the control circuit is operable to monitor one or more output signals from the at least one optical detector and to turn off drive current to the at least one VCSEL in response to a determination that the VCSEL radiation sensed by the at least one optical detector exceeds a predetermined threshold value. In some implementations, a determination that the VCSEL radiation sensed by the at least one optical detector exceeds the predetermined threshold value is indicative that a VCSEL beam exiting the module does not meet an eye-safe level.

Some implementations include one or more of the following features. For example, the module can include a package in which the at least one VCSEL and the at least one optical detector are mounted, the package including sidewalls, wherein the optical component is attached to the sidewalls. The package can comprise a molded cavity structure having electrical contact pads inside the cavity, the package further comprising electrical feedthrough connections extending through a bottom base of the cavity structure to contact pads on an outside of the bottom base. In some instances, the contact pads on the outside of the bottom base are configured for surface mounting to a printed circuit board. In some cases, the at least one VCSEL includes a surface mount VCSEL having contacts on its non-emitting side electrically bonded directly to the contact pads inside the cavity. The electrical feedthrough connections and the contact pads can be composed, for example, of copper or aluminum. The molded cavity structure can be composed, for example, at least in part of thermal set plastic that withstands surface mount process temperatures.

In some implementations, the package encloses the VCSEL device in a sealed environment. The module can include a printed circuit board, wherein the package and the control circuit are mounted on the printed circuit board.

The optical element can comprise, for example, at least one of a diffuser lens, a microlens array, a Fresnel optical structure, or a diffractive optical element. In some instances, the optical element is at least partially transmissive of the output beam of the at least one VCSEL.

The control circuit can be operable to determine, based on monitoring the one or more output signals from the at least one optical detector, whether the at least predetermined change in the intensity of the VCSEL radiation sensed by the at least one optical detector has occurred and/or whether the VCSEL radiation sensed by the at least one optical detector exceeds the predetermined threshold value.

In accordance with another aspect, a method of operating a VCSEL illuminator module includes monitoring one or more output signals from at least one optical detector in the module, and turning off drive current to the at least one VCSEL in response to a determination that there is at least a predetermined change in an intensity of VCSEL radiation sensed by the at least one optical detector or that the VCSEL radiation sensed by the at least one optical detector exceeds a predetermined threshold value.

Some implementations include one or more of the following features. For example, the determination may indicate that there is at least a predetermined change in intensity of VCSEL radiation reflected or backscattered from an optical component in the module and incident on the at least one optical detector. In some cases, the determination indicates that an optical element in the module that intersects a path of an output beam from the at least one VCSEL is at least partially dislodged or damaged. Further, in some cases, the determination indicates that a VCSEL beam exiting the module does not meet an eye-safe level. The method can include turning off the drive current in response to determining that VCSEL radiation reflected by an object outside the module and subsequently sensed by the at least one optical detector exceeds the predetermined threshold value.

In some implementations, the basic VCSEL illuminator comprises a molded package with sidewalls onto which is bonded the optical component. This assembly encloses the VCSEL and places the optical component in the VCSEL output beam to modify the propagation characteristics to form a VCSEL illumination beam suitable for the illumination application. The optical component may reduce the brightness and collimation of the VCSEL illumination beam so that it is eye safe. Thus, if the optical component is dislodged or displaced the direct output beam from the VCSEL could emerge creating a situation which is no longer eye-safe. It is important to make a signal available when this occurs so that a controller can turn off the current drive to disable the VCSEL output beam.

As described in greater detail below, in some instances, the laser eye-safety signal can be obtained by including inside the package one or more photodetectors placed adjacent to the VCSEL. In one embodiment, the photodetectors are placed to received radiation partially reflected by the optical component in the path of the VCSEL output beam. The photodetector signals for normal operation of the illuminator are recorded in the VCSEL driver control unit. If the optical component(s) is damaged or dislodged from the package the intensity and direction of the reflected radiation will change and will change the optical signal from the photodetector. This could be either an increase or decrease in photodetector signal. This change in signal is recorded by the VCSEL controller which then will turn off the VCSEL drive current turning off the VCSEL output beam.

In another embodiment, the photodetector is positioned to receive radiation reflected from subjects or objects in the path of the VCSEL illumination beam. The photodetector signal is recorded in the VCSEL driver control unit. A prior calibration level is established which corresponds to a photodetector signal when the incident VCSEL illumination beam is at the threshold for eye-safe level. If the photodetector signal is below this threshold level, then the controller operates the VCSEL normally. If the photodetected signal increases up to or above the threshold level, this indicates the subject or object is receiving VCSEL illumination beam radiation above eye safe level and the controller is programmed so that it immediately turns off the VCSEL current drive. The photodetectors are connected to other pads in the package and these routed to pads on the bottom of the package adjacent to the VCSEL connection pads.

Assembly of this miniature package results in a VCSEL illuminator module with four or more electrical pads on the bottom which can be surface mount soldered to a printed circuit board or similar electrical circuit medium used in the cell phone, tablet or similar mobile device. The electrical connection provides both activation for the VCSEL device and the laser safety signals from the photodetector(s). In this way the illuminator package can be assembled at the same time and using the same process as the other electrical components in the system.

Other aspects, features and advantages will be readily apparent from the following detailed description, the accompanying drawings and the claims.

BRIEF DESCRIPTION OF THE DRAWINGS

Different aspects of the invention describing a broad framework of the invention are presented in the detailed specification which will be better understood and appreciated in conjunction with the drawing figures in which:

FIGS. 11A and 11B show multiple photodetectors in the illuminator package for sensing when illumination above the eye-safe level is occurring.

DETAILED DESCRIPTION

Figure 1A:
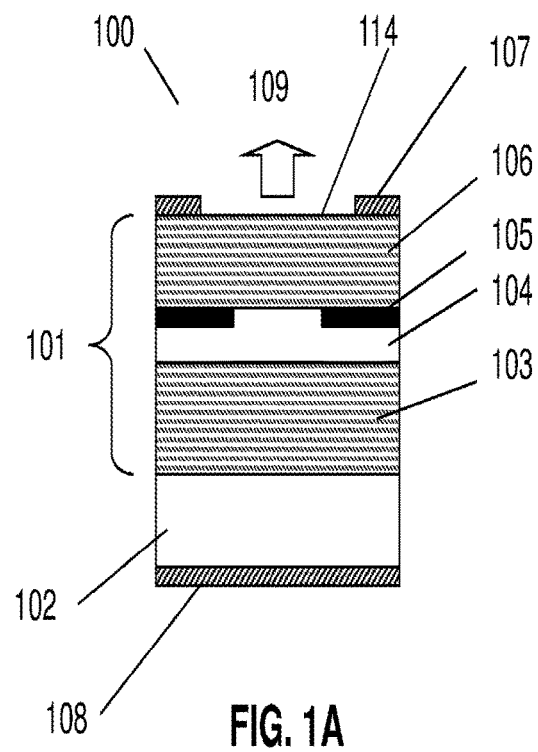
FIGS. 1A-1D show examples of current state of the art VCSEL devices. They include simple top and bottom emitting VCSEL device, extended and external 3 mirror VCSEL devices.

A broad framework of the principles will be presented by describing various aspects of this invention using exemplary embodiments and represented in different drawing figures. For clarity and ease of description, each embodiment includes only a few aspects. However, different aspects from different embodiments may be combined or practiced separately, in one or more embodiments of the invention. Many different combinations and sub-combinations of the representative embodiments within the broad framework of this invention, that may be apparent to those skilled in the art but not explicitly shown or described, should not be construed as precluded.

These and other advantages of the principles disclosed here will be apparent to those skilled in the art. There are many types of VCSEL devices including single emitters and arrays of emitters which may be used in an illuminator package. These are described next and all these types of VCSELs are included as a part of this invention.

FIG. 1 shows various types of VCSELs and VCSEL arrays 100 that can be used to build an encapsulated illumination module. FIG. 1A shows a top emitting VCSEL in which the VCSEL structure 101 is fabricated on the top of the substrate 102 and the output beam 109 is transmitted out of the top of the device through an emission surface 114. The VCSEL structure 101 comprises the bottom DBR high reflecting mirror 103 and the top DBR partially reflecting mirror 106 which transmits the output beam 109. The two mirrors form the laser resonant cavity and in between is the gain region 104. The gain region 104 consists of a group or stack of multiple quantum wells and these are typically activated by a current flowing between electrodes 108 and 107. In some designs the quantum wells are activated by shining a laser beam on them to optically pump the carriers. In VCSELs activated by current an aperture 105 is used to concentrate the current in the center region. This aperture is typically formed by oxidation although other techniques such as ion implantation can be used to form the electrically insulating region around the aperture.

Figure 1B:
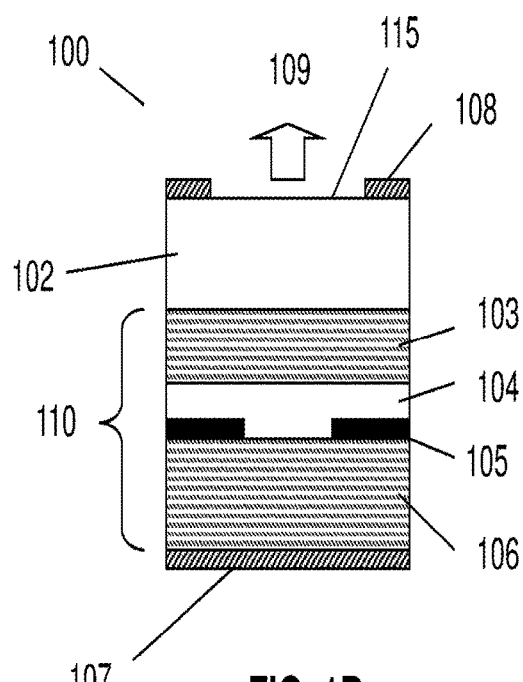

FIG. 1B shows an alternative bottom emitting VCSEL 100 in which the VCSEL structure 110 is fabricated on the bottom side of the substrate 102 with the bottom DBR mirror 103 made partially reflecting and the top mirror 106 high reflecting so that the output beam 109 is transmitted through the substrate 102 through an emission surface 115. This has the advantage that the VCSEL structure can be bonded in direct contact with a heat sink for more efficient cooling.

Figure 1C:
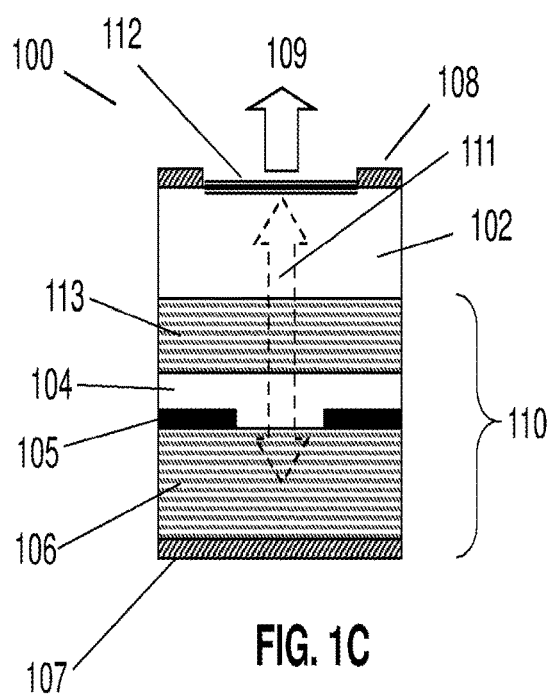
Figure 1D:
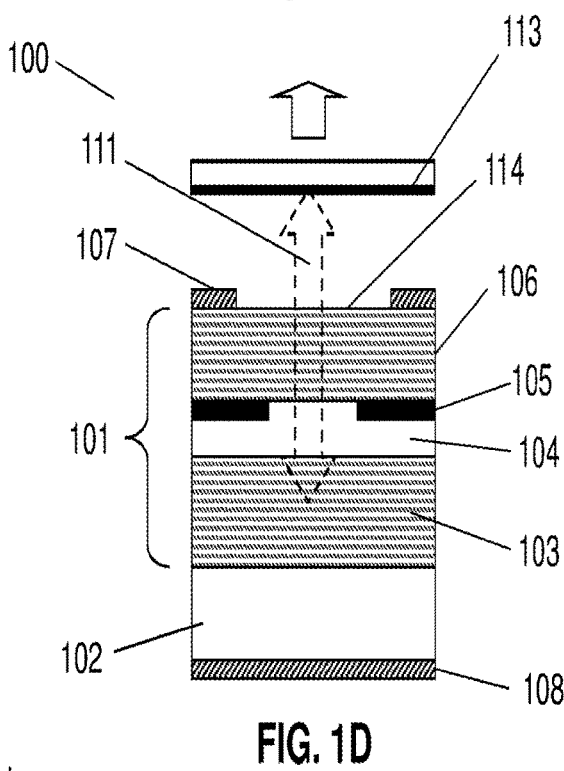

FIG. 1C describes a three-mirror extended cavity VCSEL 100. A third mirror 112 is formed on the substrate surface so that the laser resonant cavity 111 is increased in length. This has advantages in forming lower divergent output beams with fewer transverse modes to produce a higher brightness output beam. An external cavity version of this VCSEL is shown in FIG. 1D in which the third mirror 113 is a separate component allowing a much longer cavity length 111 to be used. External cavity VCSELs can be made using top emitting or bottom emitting VCSEL configurations.

In a more recent VCSEL design 200 multiple stacks of quantum wells 223 are used to obtain higher gain, increased output beam power and higher efficiency. Tunnel junctions 224 are used between the stacks to separate them. Details of a top emitting version are described in FIG. 2. The VCSEL comprises an epitaxial grown layer structure on the substrate 202. The two cavity mirrors are DBR mirrors 203, 206 of multiple layers of alternating high and low refractive index. The bottom reflector 203 is made high reflecting and the top reflector 206 partial transmitting.

Above the bottom reflector is the gain section 221 which consists of multiple groups of quantum wells 223. Each group of quantum wells 223 can have 2 to 4 quantum wells or more depending on the specific design configuration. Each group of multiple quantum wells is located at the anti-node or maximum optical intensity of the laser cavity mode. This results in maximum application of gain to the laser mode.

Figure 2:
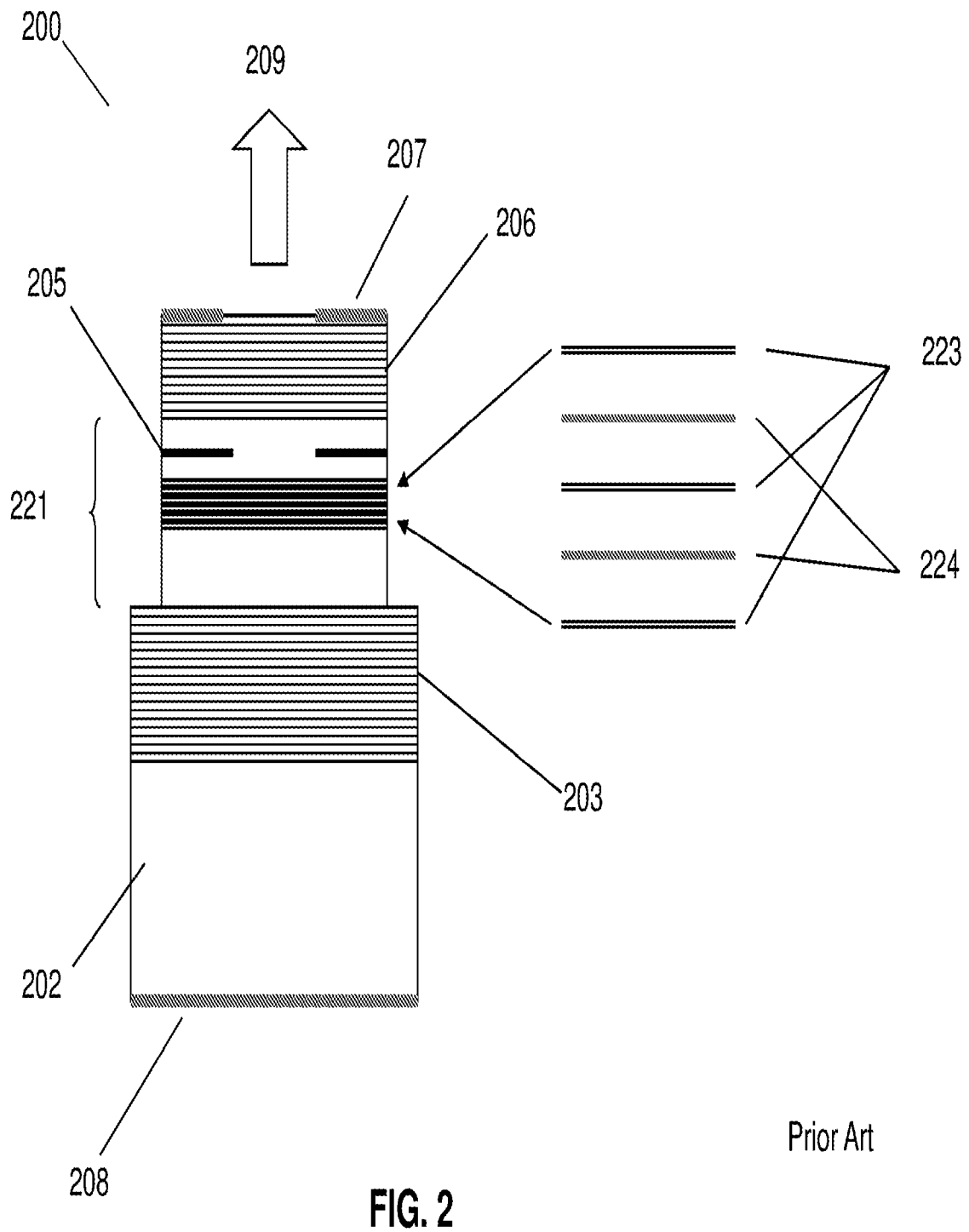
FIG. 2 describes a new high power top emitting VCSEL design that includes multiple gain groups of multiple quantum wells separated by tunnel junction diodes.

In the example 200 in FIG. 2 there are 3 groups of quantum wells 223. In between the groups of quantum wells 223 are located tunnel junctions 224. These are very thin pn junctions so that carriers can pass (or tunnel) through the junction barrier. The tunnel junctions are located at the nodes of the laser cavity mode to minimize any absorption effects. In the example in FIG. 2 there are thus two tunnel junctions 224, an aperture 205, and a top contact 207. Since there are 3 groups of quantum wells the gain is 3 times larger than that of the standard VCSEL and also the gain section is 3 times longer. This also results in up to 3 times higher output beam 209 power for the same activation current.

Figure 3:
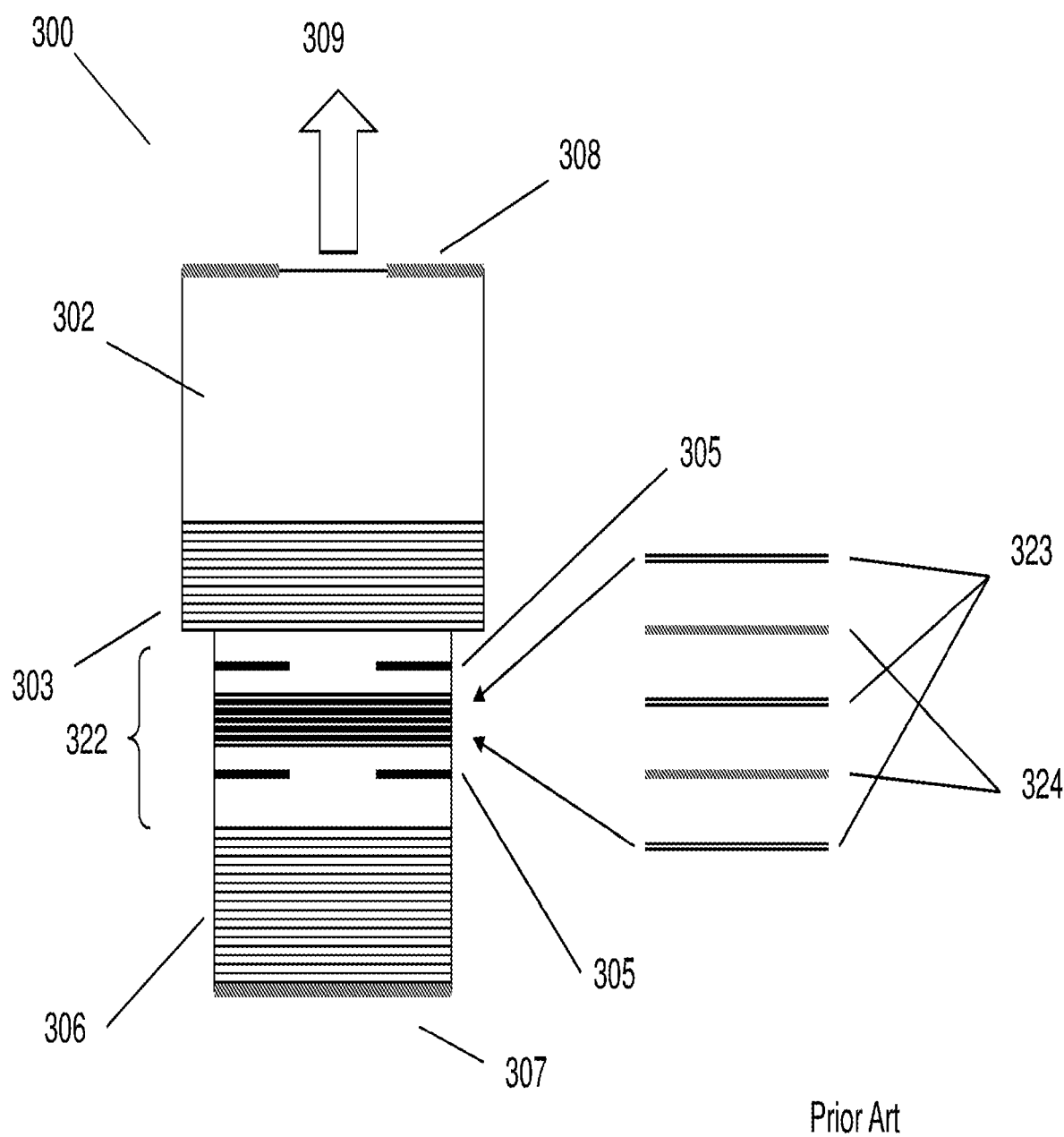
FIG. 3 shows a bottom emitting version of the new high power VCSEL design.

FIG. 3 shows another configuration for a high power VCSEL device 300. In this example 300 the VCSEL is configured as a bottom emitting device wherein the output beam 309 is taken through the bottom DBR mirror 303 and transmitted through the substrate 302. In this case the top DBR mirror 306 is high reflecting and the bottom DBR mirror 303 is partial reflecting. In this embodiment, the gain region 322 has 3 groups of multiple quantum wells 323 and two intervening tunnel junctions 324. There are two current apertures 305 to confine the current, a bottom electrical contact 307, and a top electrical contact 308. Using two apertures can provide improved current flow in the longer gain region.

For top emitting VCSELs the substrate 202 can be thinned and in some configurations can be removed entirely. This improves the heat transfer from the gain region to the bottom contact 208. The substrate 302 can also be removed for bottom emitting VCSELs; the reason for doing this is different however and it would be done to reduce optical absorption in the substrate. This is important for short wavelength VCSELs in which the substrate absorption would be high.

These and many other configurations are possible and more details are disclosed in U.S. patent application Ser. No. 14/700,010 by Wang et al filed on Apr. 29, 2015 and U.S. Provisional Patent application No. 62/303,632 by Ghosh et al. filed on Mar. 4, 2016. Contents of these applications are co-authored by some of the inventors of this application and co-owned by Princeton Optronics Inc. Mercerville, N.J., and are being incorporated by reference in their entirety.

It will be apparent to those skilled in the art that various high speed and CW multiple quantum well group VCSELs and VCSEL array configurations and types can be used for many different miniature illuminator applications using the few examples described above. This includes VCSELs with different quantities of groups with multiple quantum wells.

Figure 4:
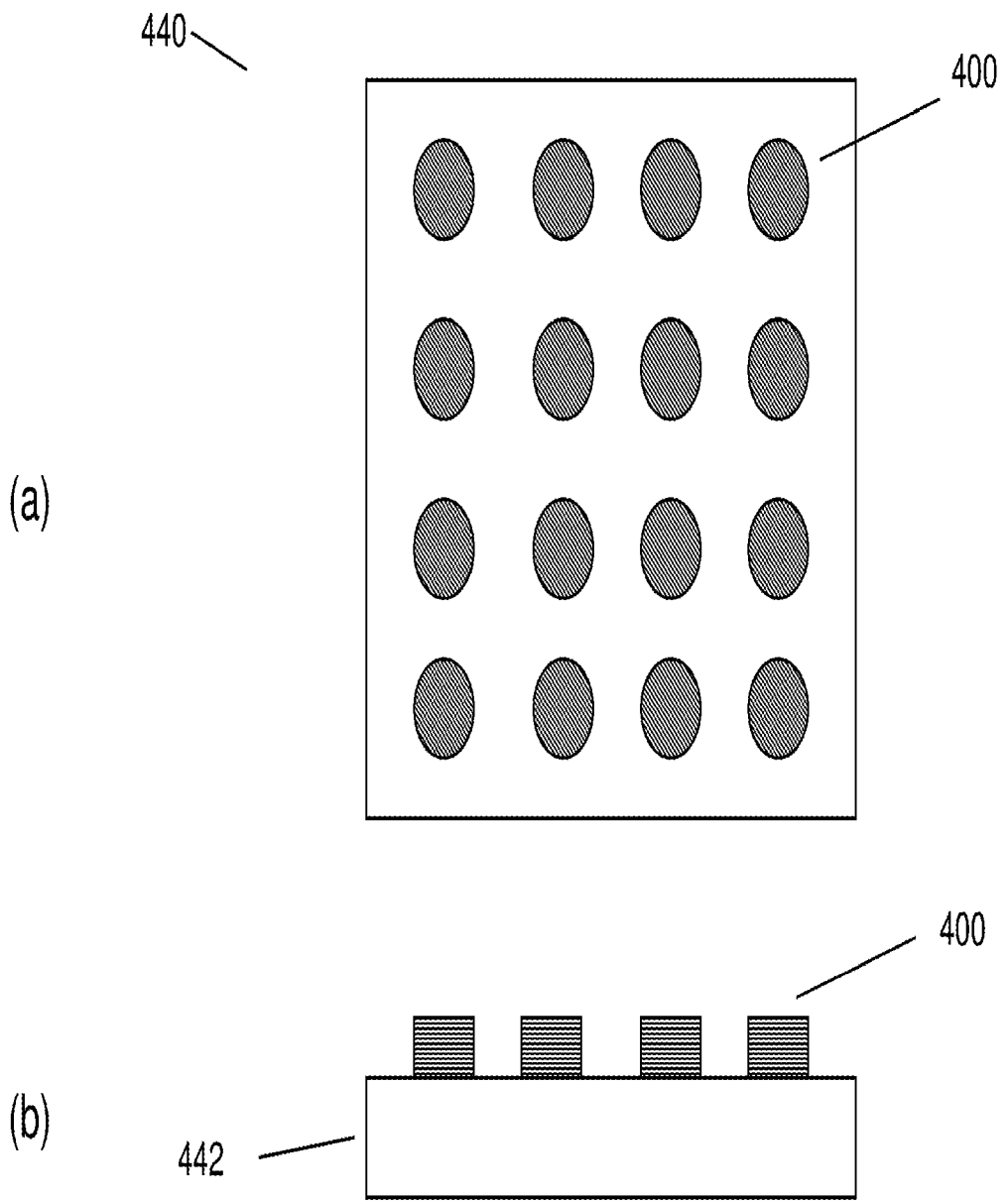
FIGS. 4(a) and 4(b) illustrate how any of the aforementioned VCSELs can be arranged in arrays fabricated on a commons substrate. This provides higher output beam power for the same brightness.

FIG. 4 shows an example 400 of a VCSEL array in 2-dimensional square format 440 with 16 VCSELs fabricated on a common substrate 442. Many different formats can be used including hexagonal or even random distributions to optimally match the output to the illumination requirements for the application. The VCSELs can be activated together or separate electrical connections provided so that individual or groups of VCSELs can activated in various sequences or patterns. These groups can be segmented or interleaved depending on the particular illumination pattern required for the application.

Smaller VCSELs can be more efficient and building arrays is a good method to create higher power VCSELs while maintaining high efficiency. Also by having multiple VCSEL emitters the speckle is reduced since the multiple VCSELs devices are not coherent to each other. Finally using VCSEL arrays increases the illumination beam power but results in much less increase the brightness since the ratio of power to the product of emitting area and divergence angle product is not increased. This means that the illumination beam power can be increased while still maintaining eye-safe power levels.

Examples of miniature illuminators using VCSEL devices have been developed and are described in U.S. Pat. No. 9,553,423 B2 authored by Tong Chen et al issued Jan. 24, 2017. Contents of this patent are co-authored by some of the inventors of this application and co-owned by Princeton Optronics Inc. Mercerville, N.J., and are being incorporated by reference in their entirety. Embodiments of the invention overcome the complexity of current miniature illuminators by using a single molded structure which includes all the electrical pad feedthroughs and has the features necessary for mounting optical components.

The molded package structure has a cavity in which the VCSEL device is mounted. The cavity has two or more electrical pads for connecting to the VCSEL bottom contact (s) and these pads are electrical feedthroughs to the bottom of the package structure to provide surface mount soldering electrical pads. One of the pads can also provide direct mounting for the VCSEL contact to additionally provide a thermal path for cooling the VCSEL. The VCSEL second connection is obtained using wirebonding to the second pad(s). If the VCSEL is configured for surface mounting with both contacts on the bottom, then it can be directly surface mounted onto the internal pads in the package without the need for the wirebond contact.

The molded package structure has sidewalls of a specified height on which is mounted one or more optical components for modifying the VCSEL output beam properties. The sidewall height is designed so that when the optical component is attached at this height the illumination beam emerging from the optical component has the desired illumination pattern. Bonding of the optical components to the structure can also provide a hermetic or laser safety seal for the VCSEL.

Figure 5:
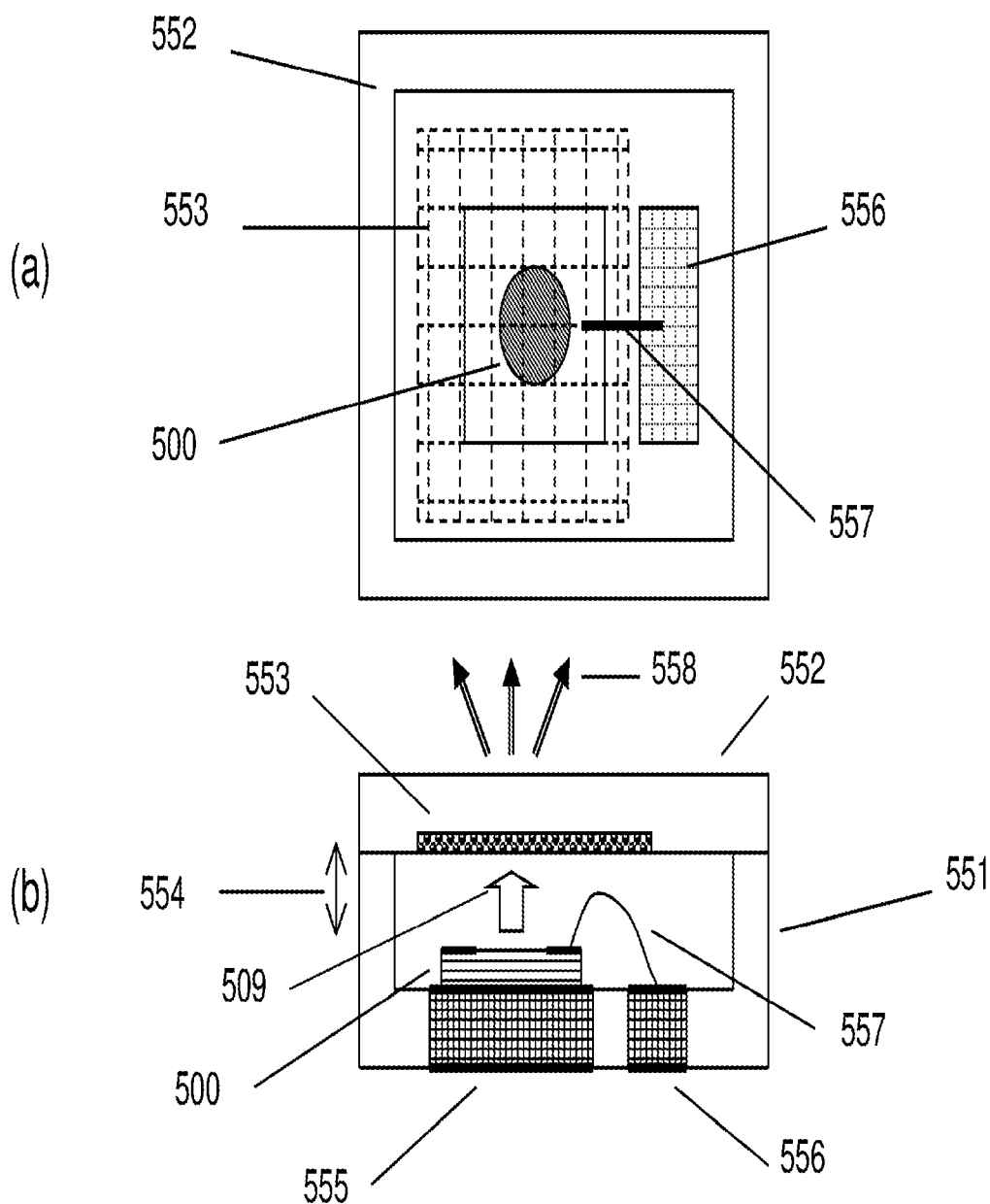
FIGS. 5(a) and 5(b) are schematic drawings of the miniature VCSEL package. The molded structure has feed-through electrical pads from the inside to the bottom outside.

The basic miniature illumination package is described in FIG. 5. The molded package structure 551 has a cavity into which is mounted the VCSEL device 500; this can be a single VCSEL or an array. The package has conductive feedthroughs 555, 556 with pads on the inside for the VCSEL and on the outside for surface mount soldering to a printed circuit board. In this example the VCSEL is directly bonded to one of the pads 555 using solder or similar electrically conducting bonding material. This provides one electrical contact as well as providing thermal conducting path. The second or more electrical contacts are made to the VCSEL using wirebonding 557 to the second or more pads 556. If the VCSEL array has multiple contacts on the non-emitting side, then corresponding multiple pads are used for soldering the VCSEL array in the package.

The optical component 552 is bonded to the top of the sidewalls of the package 551. The optical component can be a diffuser, lens, microlens array, diffractive optical element or some other functioning structure 553 for modifying the characteristics 558 of the VCSEL output beam(s) 509. The functioning structure 553 can be formed on either the top surface or the bottom surface of the optical component or be an integral structure with the function internal such as a graded index structure. The height 554 and lateral position of the optical component is determined by the design parameters of the sidewalls of the molded package so that no spacer or other extra piece-part is needed for this alignment.

Figure 6A:
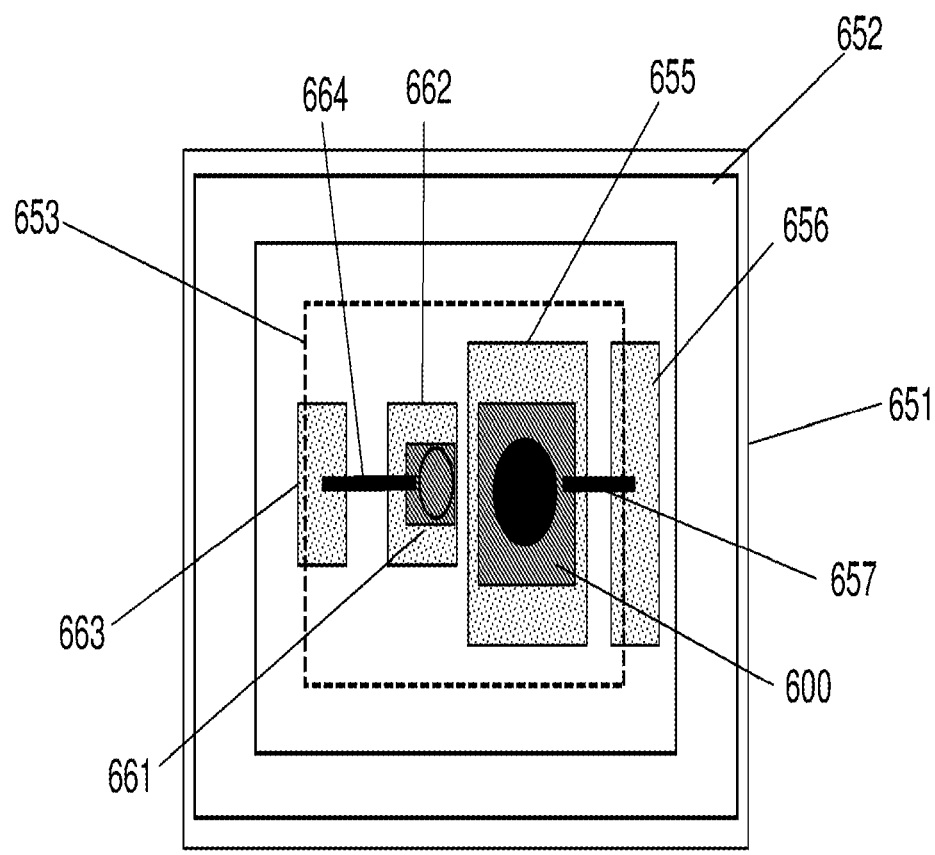
FIGS. 6A and 6B illustrate one embodiment of the laser safety feature for the VCSEL package. A photodetector is mounted alongside the VCSEL. It is arranged to receive radiation back-reflected from the optical component.
Figure 6B:
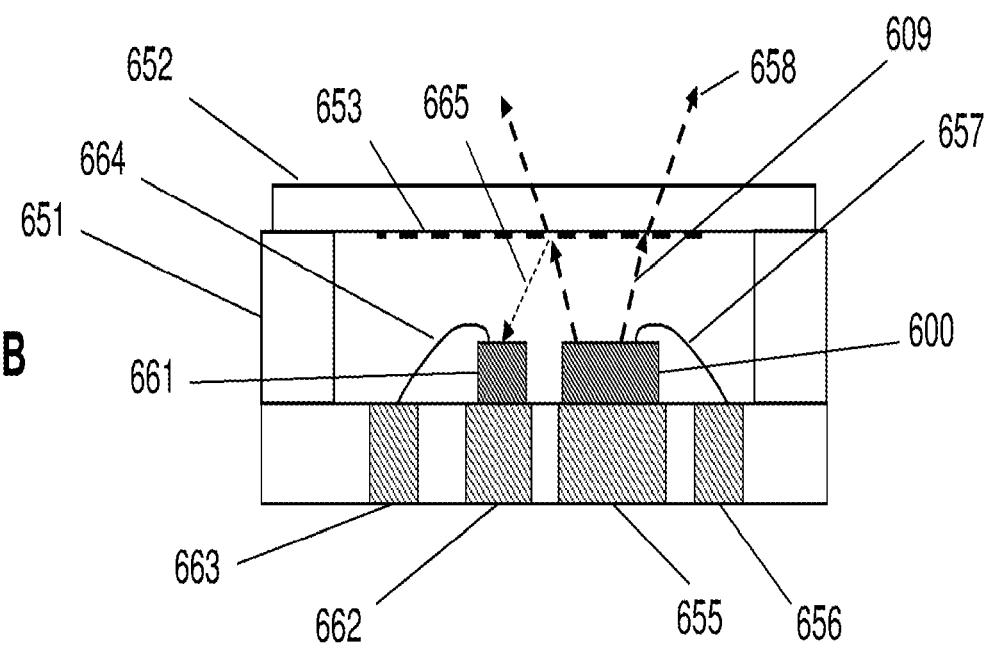

The arrangement for obtaining the laser safety signal is described in FIG. 6. A photodetector 661 is mounted beside the VCSEL 600 and aligned to receive output beam radiation 665 from the VCSEL 600 which is reflected from the optical component 652. The optical component may be uncoated or have a thin film coating 653 designed to provide a desired reflection coefficient. There are two contacts pads 662 and 663 for electrical connection to the photodetector. These are connected through the package 651 to contact pads on the bottom of the package. The contact pad 663 is connected to the photodetector using wirebonding 664. This photodetector can also be used as a monitor detector for controlling the output beam 609, 658 power of the VCSEL 600. There are two contacts pads 655 and 656 for electrical connection to the VCSEL 600. The contact pad 656 is connected to the VCSEL 600 using wirebonding 657. It will be apparent to persons skilled in the art that the photodetector(s) can alternately be fabricated in the same substrate as the VCSEL 600 resulting in a more compact illuminator package.

Figure 7A:
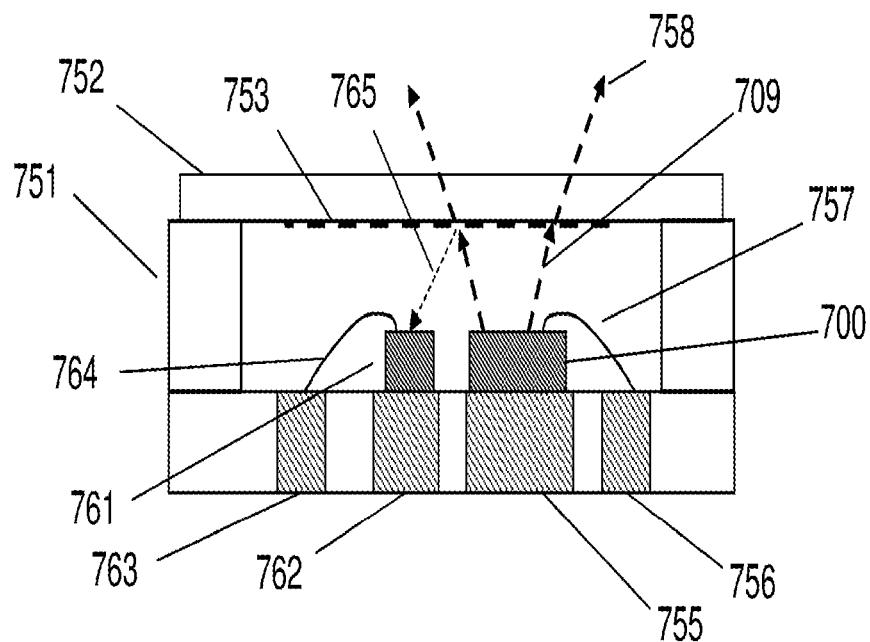
FIGS. 7A and 7B are show the same package as FIGS. 6A and 6B, with a view of the bottom side of the package showing the electrical pads to the VCSEL and photodetector for surface mount soldering.
Figure 7B:
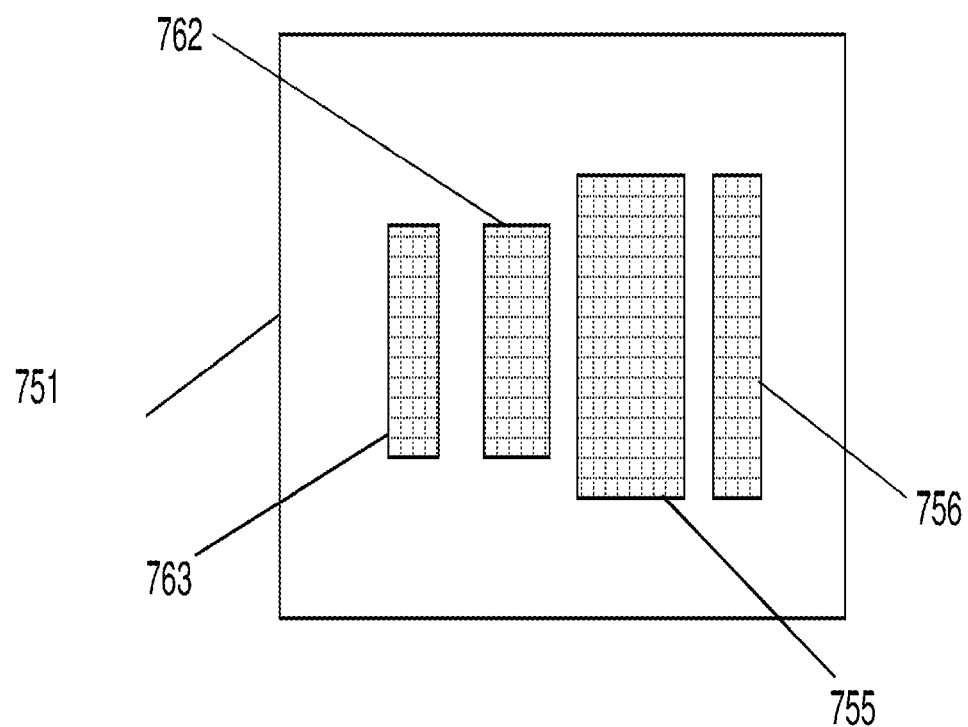

FIG. 7 is a schematic drawing of the same package 751 showing a bottom view describing a typical arrangement of the electrical pads 755, 756, 762, 763. A photodetector 761 is mounted beside the VCSEL 700 and aligned to receive output beam radiation 765 from the VCSEL 700 which is reflected from the optical component 752. The optical component may have a thin film coating 753. The contact pad 763 is connected to the photodetector 761 using wirebonding 764.

The contact pad 756 is connected to the VCSEL 700 using wirebonding 757. This illuminator package is surface mountable and can be soldering to a printed circuit board using high volume manufacturing electronic assembly processes. The package would be connected to a controller that provides the VCSEL 700 drive current. The VCSEL 700 provides an output beam 709, 758. This controller includes the function which monitors the photodetector signal and is programmed to turn off the VCSEL 700 drive current when an anomalous signal indicating non eye-safe condition is received from the photodetector.

FIG. 8 illustrates the laser safety function of the illuminator package 851. The VCSEL 800 in conjunction with the optical component will provide an output illumination beam which meets the regulation eye safe level at a prescribed distance from the package 851. The optical component may have a thin film coating 853. There are two contacts pads 862 and 863 for electrical connection to the photodetector. There are two contacts pads 855 and 856 for electrical connection to the VCSEL 800. The contact pad 863 is connected to the photodetector 861 using wirebonding. The contact pad 856 is connected to the VCSEL 800 using wirebonding. Normally the illuminator is mounted in a housing and the perimeter of the housing is at the eye safe distance so that persons coming close to or in contact with the housing will not encounter VCSEL output beam which exceeds the eye-safe level. However, if the optical component is damaged or dislodged from the package 851 all or part of the VCSEL output beam with native divergence and high irradiance could propagate out of the package 851 and out of the housing. Persons coming close to the housing could then be exposed to illumination beam which may exceed the eye-safe level.

Figure 8A:
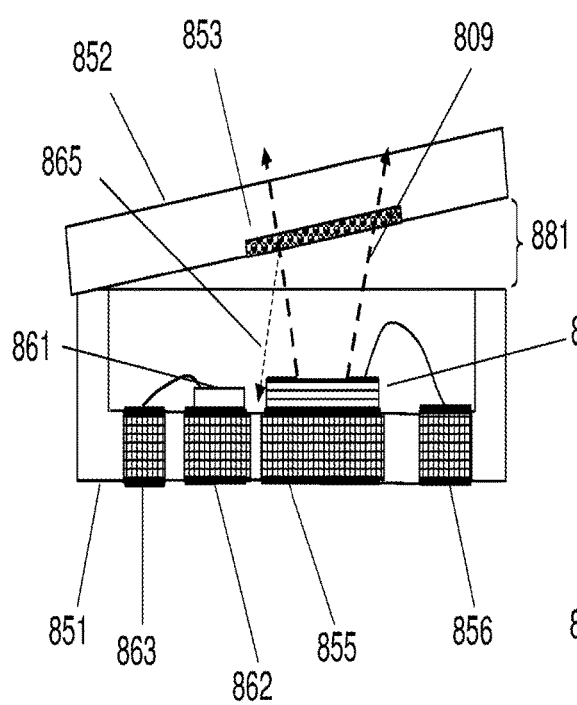
FIGS. 8A and 8B show operation of the laser safety interrupt. If the optical component is detached in part or wholly from the package structure the optical back-reflection intensity and direction changes altering the photodetector output signal.

Referring to FIG. 8A, it shows the optical component 852 partially dislodged 881 from the package. FIG. 8A shows the optical component tilted up however the optical component could also be laterally displaced or broken with parts of the optical component tilted or laterally displaced fully or partially out of the VCSEL beam 809. The effect of all these possible changes results in a change in the VCSEL output beam reflected 865 onto the photodetector 861. The change in photodetector signal could be negative or even positive depending on how the optical component is damaged or dislodged. The VCSEL driver controller would monitor the photodetector signal and upon receiving this signal change would turn off the drive current to the VCSEL.

Figure 8B:
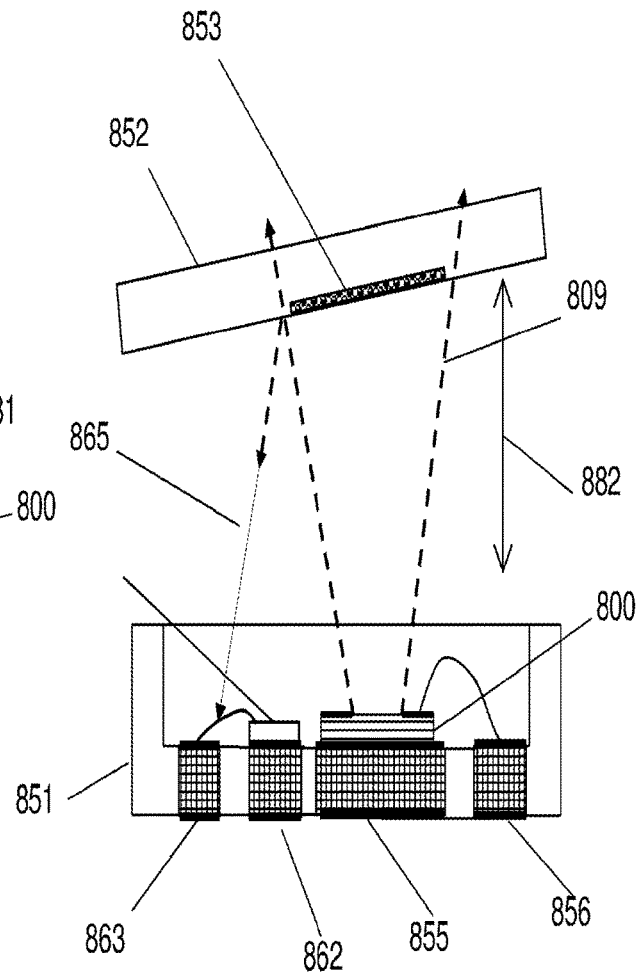

FIG. 8B shows a more catastrophic damage to the illuminator package 851 in which the optical component is completely separated 882 from the package 851. In this situation, it is likely a much smaller reflected intensity would fall on the photodetector. The result would be basically the same in that there would be a change in the detector signal to the VCSEL controller and the controller would then turn off the VCSEL current.

Figure 9:
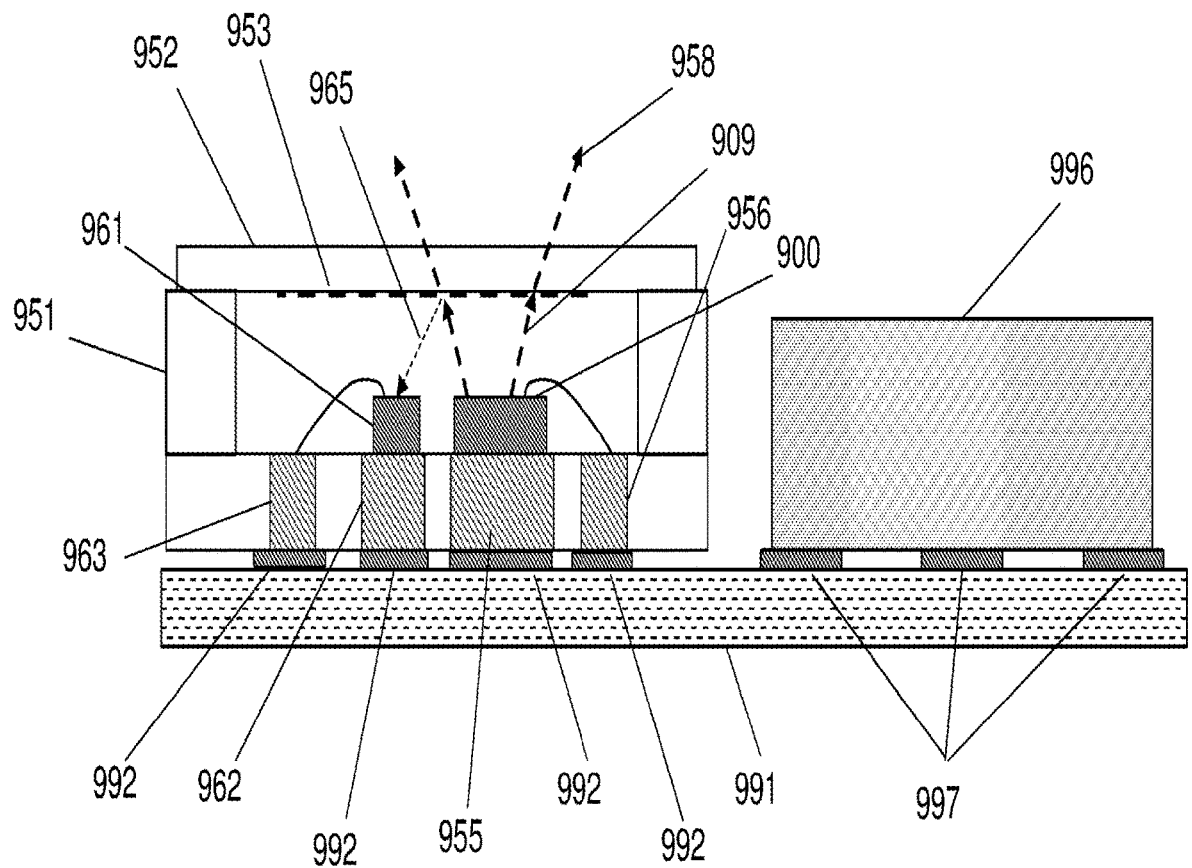
FIG. 9 illustrates how the illuminator is surface mounted on a printed circuit board with an integrated circuit VCSEL controller.

FIG. 9 illustrates how a complete module would be assembled with the illuminator and the VCSEL drive current controller. A VCSEL 900 provides an output beam 909, 958. A photodetector 961 is mounted beside the VCSEL 900 and aligned to receive output beam radiation 965 from the VCSEL 900 which is reflected from the optical component 952. The optical component 952 is bonded to the top of the sidewalls of the package 951. The optical component 952 may have a thin film coating 953. The contact pad 963 is connected to the photodetector 961 using wirebonding. The contact pad 956 is connected to the VCSEL 900 using wirebonding. The Illuminator is surface mount soldered 992 via electrical contact pads 955, 956, 962, 963 to the printed circuit board 991. The VCSEL current driver control IC 996 is surface mount soldered 997 to the printed circuit board. In practice both components would be surface mount soldered in the same operation; this could also include soldering many other components in the overall system. The printed circuit board has matching electrical pads for the Illuminator and IC with appropriate electrical conductor paths to interconnect them. There would be other electrical pads or connections on the printed circuit board for connecting to other parts of the overall system.

Figure 10:
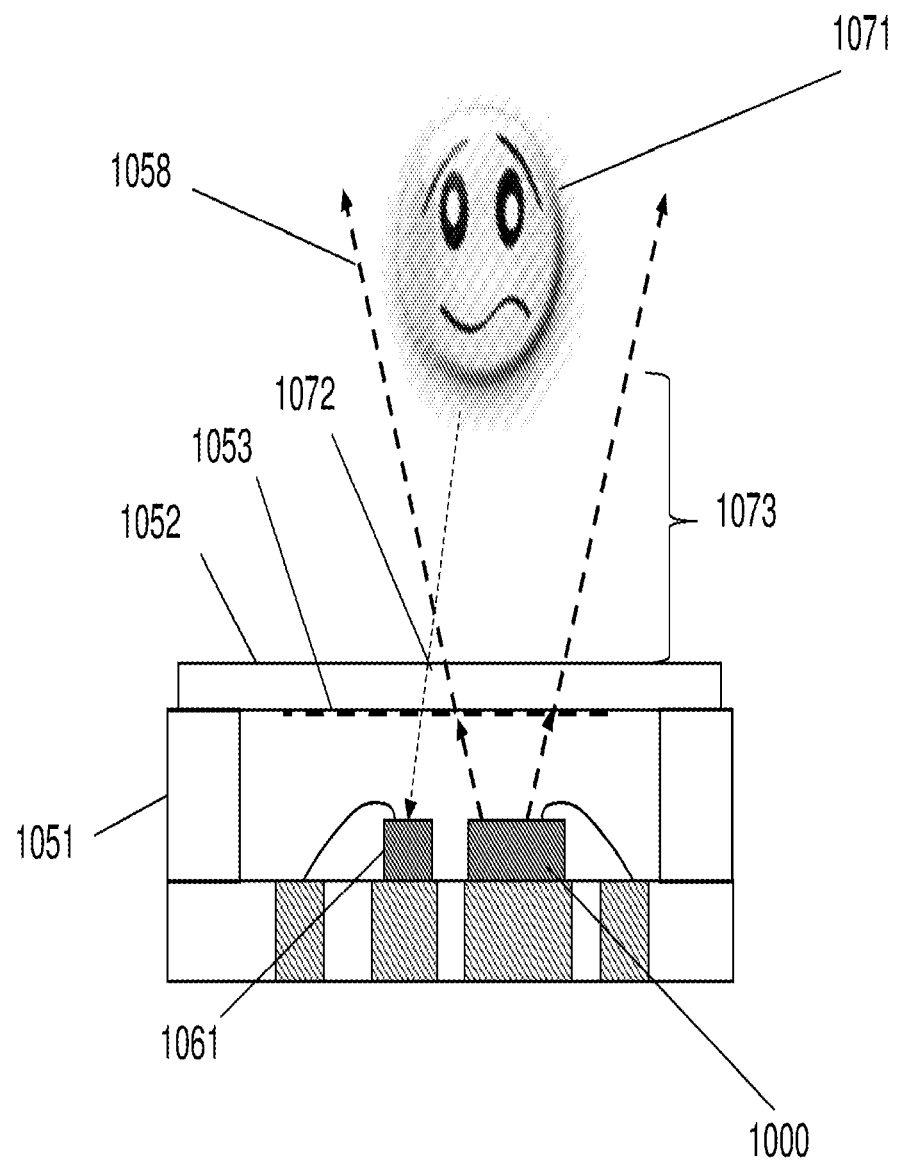
FIG. 10 shows an alternative configuration for the eye-safe VCSEL illuminator. The photodetector is arranged to received radiation reflected back from a person illuminated by the VCSEL radiation.

An alternative method for sensing the eye-safe condition is illustrated in FIG. 10. It uses the same VCSEL 1000 and photodetector 1061 arranged adjacent to each other in the package 1051. The VCSEL 1000 provides an output beam 1058. An optical component 1052 may have a thin film coating 1053. In this embodiment of the invention instead of detecting a VCSEL output beam reflection from the optical component a direct detection of VCSEL illumination beam reflected 1072 from a subject 1071 or object is detected. The photodetector signal is calibrated in the controller so that if the reflected illuminator beam exceeds a threshold value the controller turns off the VCSEL drive current. The controller threshold value is calibrated to correspond to a subject distance 1073 from the illuminator which would expose the subject to VCSEL illuminator beam above the eye-safe level. In this arrangement the reflectivity of the optical component could be reduced so that its reflected signal is not confused with the subject reflection signal. This is not essential however and the controller could be programmed to evaluate photodetector signals from both events. Recording damage to the illuminator could be an important feature of the overall system. The reflectivity of the optical component and the subject can also be differentiated from ambient light using temporal or spectral filtering.

The preceding discussions described the use of a single photodetector, however, multiple photodetectors 1161, 1174 can be used as shown in an example schematic in FIG. 11. A VCSEL 1100 provides an output beam 1158. The photodetectors 1161, 1174 are mounted beside the VCSEL 1100 and aligned to receive output beam radiation 1165, 1172, 1177, 1178 from the VCSEL 1100 which is reflected from the optical component 1152. The optical component 1152 is bonded to the top of the sidewalls of the package 1151. The optical component 1152 may have a thin film coating 1153. The contact pad 1156 is connected to the VCSEL 1100 using wirebonding 1157. The contact pad 1155 is for electrical connection to the VCSEL 1100 and is connected through the package 1151. The contact pad 1176 is connected to the photodetector 1174 using wirebonding 1179. In this example three photodetectors 1161, 1174 are mounted around the VCSEL device 1100. The photodetectors 1161, 1174 can receive reflected 1165, 1177 VCSEL output beam from the optical component 1165, 1177 or reflected illumination beam from a subject in the field of view or both. Using multiple photodetectors enables more flexibility in assessing eye-safe conditions as well as providing redundancy and improved reliability.

When multiple photodetectors 1161 and 1174 are placed at different distance with respect to the VCSEL device 1100, photodetectors 1161 and 1174 will receive different levels of signal according to the unique reflective beam profile of the VCSEL devices. The differential signal can be used as the gauge for the interlocking of beam shaping optical elements. Meanwhile, external reflection from a subject or object 1171 will generate a uniform response offset on 1161 and 1174. Using this different failure modes can be identified.

Each photodetector has electrical pads 1162, 1163, 1175, 1176 in the package so that separate connections to each photodetector is made. In some cases one 1175 of the two photodetector contacts can be common to multiple photodetectors.

In view of the foregoing description, it will be apparent that many different configurations of the eye-safe illuminator package can be designed and made depending on the application and assembly requirements of the product that will use it. Although a broad framework of the invention is described with reference to a few preferred embodiments, other embodiments may be configured by applying combinations and sub-combinations of elements described herein, depending on particular VCSELs or VCSEL arrays required for the illuminator applications. Variations and modifications of different embodiments both with or without different optical structures and mirrors will be apparent to those skilled in the art. Accordingly, other implementations are within the scope of the claims.

What is claims is:

1. A vertical cavity surface emitting laser (VCSEL) illuminator module comprising:
   at least one VCSEL device;

an optical element disposed over the at least one VCSEL device, the optical element being arranged in a path of an output beam of the at least one VCSEL and operable to modify a characteristic of the output beam;

at least one optical detector arranged to receive and sense VCSEL radiation reflected or backscattered from the optical element; and a control circuit coupled to the at least one VCSEL and to the at least one optical detector, wherein the control circuit is operable to monitor one or more output signals from the at least one optical detector and to turn off drive current to the at least one VCSEL in response to a least a determination that there is a predetermined decrease in an intensity of the VCSEL radiation sensed by the at least one optical detector;

wherein the determination that there is at least the predetermined decrease in an intensity of the VCSEL radiation reflected or backscattered from the optical element and incident on the at least one optical detector indicates that the optical element is at least partially dislodged or damaged.

2. The VCSEL illuminator module of claim 1, including a package in which the at least one VCSEL and the at least one optical detector are mounted, the package including sidewalls, wherein the optical element is attached to the sidewalls.

3. The VCSEL illuminator module of claim 2 wherein the package comprises a molded cavity structure having electrical contact pads inside the cavity, the package further comprising electrical feedthrough connections extending through a bottom base of the cavity structure to contact pads on an outside of the bottom base.

4. The VCSEL illuminator module of claim 3 wherein the contact pads on the outside of the bottom base are configured for surface mounting to a printed circuit board.

5. The VCSEL illuminator module of claim 3 wherein the at least one VCSEL device includes a surface mount VCSEL having contacts on its non-emitting side electrically bonded directly to the contact pads inside the cavity.

6. The VCSEL illuminator module of claim 3 wherein the electrical feedthrough connections and the contact pads are composed of copper or aluminum.

7. The VCSEL illuminator module of claim 3 wherein the molded cavity structure is composed at least in part of thermal set plastic that withstands surface mount process temperatures.

8. The VCSEL illuminator module of claim 3 wherein the package encloses the VCSEL device in a sealed environment.

9. The VCSEL illuminator module of claim 2 including a printed circuit board, wherein the package and the control circuit are mounted on the printed circuit board.

10. The VCSEL illuminator module of claim 1 wherein the control circuit is operable to determine, based on monitoring the one or more output signals from the at least one optical detector, whether the predetermined decrease in an intensity of the VCSEL radiation sensed by the at least one optical detector has occurred.

11. A VCSEL illuminator module comprising:
at least one VCSEL device;
an optical element disposed over the at least one VCSEL device, the optical element being arranged in a path of an output beam of the at least one VCSEL and operable to modify a characteristic of the output beam;

at least one optical detector arranged to receive and sense VCSEL radiation reflected from an object outside the module;

a control circuit coupled to the at least one VCSEL and to the at least one optical detector, wherein the control circuit is operable to monitor one or more output signals from the at least one optical detector and to turn off drive current to the at least one VCSEL in response to a determination that the VCSEL radiation sensed by the at least one optical detector exceeds a predetermined threshold value.

12. The VCSEL illuminator module of claim 11 wherein the determination that the VCSEL radiation sensed by the at least one optical detector exceeds the predetermined threshold value is indicative that a VCSEL beam exiting the module does not meet an eye-safe level.

13. The VCSEL illuminator module of claim 11 wherein the optical element comprises at least one of a diffuser lens, a microlens array, a Fresnel optical structure, or a diffractive optical element.

14. The VCSEL illuminator module of claim 11 wherein the optical element is at least partially transmissive of the output beam of the at least one VCSEL.

15. The VCSEL illuminator module of claim 11 wherein the control circuit is operable to determine, based on monitoring the one or more output signals from the at least one optical detector, whether the VCSEL radiation sensed by the at least one optical detector exceeds the predetermined threshold value.

16. A method of operating a VCSEL illuminator module, the method comprising:
monitoring one or more output signals from at least one optical detector in the module; and
turning off drive current to at least one VCSEL device in response to at least a determination that there is a predetermined decrease in an intensity of VCSEL radiation sensed by the at least one optical detector or that the VCSEL radiation sensed by the at least one optical detector is below a predetermined threshold value.

17. The method of claim 16 wherein the determination indicates that there is at least a predetermined decrease in intensity of VCSEL radiation reflected or backscattered from an optical component in the module and incident on the at least one optical detector.

18. The method of claim 16 wherein the determination indicates that an optical element in the module that intersects a path of an output beam from the at least one VCSEL is at least partially dislodged or damaged.

19. The method of claim 16 wherein the determination indicates that a VCSEL beam exiting the module does not meet an eye-safe level, and optionally the method including turning off the drive current in response to determining that VCSEL radiation reflected by an object outside the module and subsequently sensed by the at least one optical detector exceeds the predetermined threshold value.

* * * * *